United States Patent [19]
Oyama et al.

[11] 3,974,399
[45] Aug. 10, 1976

[54] ACTIVE HIGH Q FILTER USING TRANSISTOR

[75] Inventors: Satoshi Oyama; Akira Takahashi, both of Omiya, Japan

[73] Assignee: Yagi Antenna Co., Ltd., Tokyo, Japan

[22] Filed: Dec. 27, 1974

[21] Appl. No.: 536,849

[30] Foreign Application Priority Data
May 9, 1974  Japan............................ 49-51665[U]
May 9, 1974  Japan............................ 49-51666[U]

[52] U.S. Cl. .................... 307/233 R; 333/80 T; 333/70 CR; 307/253; 307/295
[51] Int. Cl.² ...................................... H03K 17/00
[58] Field of Search ............ 307/253, 295, 233, 229; 333/80 T, 80 R, 70; 328/167; 330/107, 109

[56] References Cited
UNITED STATES PATENTS

| | | |
|---|---|---|
| 3,152,309 | 10/1964 | Boqusz et al. .................... 333/80 T |
| 3,267,397 | 8/1966 | Skinner .............................. 333/80 T |
| 3,594,593 | 7/1971 | Ho ..................................... 333/80 T |
| 3,680,011 | 7/1972 | Adams et al. ...................... 333/80 T |

Primary Examiner—Stanley D. Miller, Jr.
Assistant Examiner—B. P. Davis
Attorney, Agent, or Firm—James E. Nilles

[57] ABSTRACT

Disclosed is a two-terminal active impedance circuit which comprises a transistor having emitter connected to one terminal of the circuit through a resistor, collector and base directly connected to each other, and a capacitor connected between the one terminal and the collector, said base being applied with a bias voltage whereby an imaginary impedance including a negative resistance is provided between the one terminal and other terminal which is connected to the emitter. Active filters having various characteristics are disclosed in which the above impedance circuit are utilized.

10 Claims, 15 Drawing Figures

ACTIVE HIGH Q FILTER USING TRANSISTOR

BACKGROUND OF THE INVENTION

The present invention relates to a two-terminal element of a high Q comprising a transistor and further to a high frequency filter employing therein such a high Q element.

As a typical example of a negative resistance element, a tunnel diode or Esaki diode has hitherto been known. This diode, however, can not transmit a high electric power because of its narrow operational voltage range. Conventional active impedance elements incorporating therein a respective transistor encounter with difficulties in the manufacture thereof in a form of integrated circuits because various concentrated or lumped constant elements are required in the base circuit of the transistor and, besides, a high frequency choke coil is needed to ground the emitter.

The design of the filter circuits are made depending on the practical applications. The filter composed of the concentrated constant elements such as coil and capacitor always incurs insertion loss. Particularly in case of a narrow band width filter, a very large capacity type of cavity resonator must be employed as a means to solve such problem.

SUMMARY OF THE INVENTION

An object of the present invention is to provide a two-terminal impedance circuit the equivalent circuit of which, in the range of a high frequency band, can be represented by a series connection of an apparent or imaginary negative resistance and an apparent or imaginary inductance with a simplified circuit arrangement using a transistor without actual inductance element.

Another object of the present invention is to produce an imaginary inductance including a negative resistance component in a lower frequency band range by additionally providing an inductance element of a lumped constant exteriorly of the two-terminal impedance circuit as above mentioned.

Still another object of the invention is to provide a band pass active filter of a small size and a light weight insusceptible to the insertion loss constituted by connecting a capacitor in parallel with the two-terminal impedance circuit.

Other object of the present invention is to provide a band rejection active filter of the same kind constituted by connecting a capacitor in series to the two-terminal impedance circuit.

A still further object of the invention is to provide an active filter of a band rejection type which can pass only the desired signal component of input signal with substantially no loss or even with amplification, while undesired signal component is attenuated to a possible maximum degree and thus exhibit a steep attenuation characteristic in which the passing and stopped frequencies are very close to each other by connecting a capacitor or impedance in parallel with band rejection type active filter as above mentioned.

Another object of the present invention is to provide a filter which, if no actual inductance element is employed, can easily be manufactured in a form of an integrated circuit of a small size and a light weight at low costs.

The above and other objects as well as novel features and advantages of the invention will become more apparent from the following description of preferred embodiments of the invention. The description makes reference to the drawings.

DETAILED DESCRIPTION OF PREFERRED EMBODIMENTS

Figure 1:
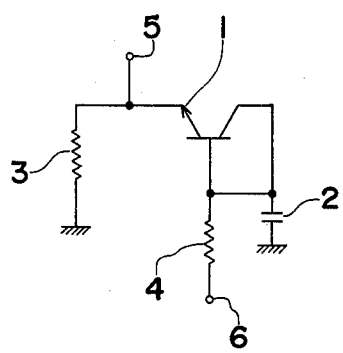
FIG. 1 is a circuit diagram showing a basic arrangement of a two-terminal active impedance circuit according to the invention which includes a negative resistance component and an inductance component.
Figure 2:
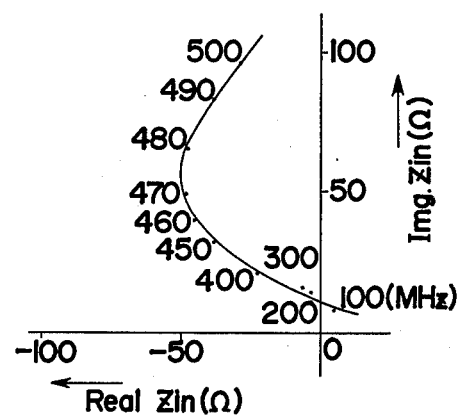
FIG. 2 is a graph illustrating a variation of impedance of the circuit shown in FIG. 1.

FIG. 1 shows a two-terminal impedance circuit including a single npn-type transistor 1 as an active element. The base and collector of the transistor 1 is connected directly to each other with a capacitor 2 inserted between the collector and the earth. The base of the transistor 1 is applied with a d.c. bias voltage from a terminal 6 through a resistor 4. Connected between the emitter electrode and the earth is a resistor 3 which grounds the emitter in respect of d.c. current component and insulates the emitter from the earth in respect of a high frequency component. With such circuit arrangement, the two-terminal impedance Zin of the circuit formed between a terminal 5 connected to the emitter electrode and the earth is varied in dependence upon the transistor actually employed and the bias voltage applied to the transistor 1 from the terminal 6. For example, when transistor 2SC1406 is employed with the capacitor 2 of $0.001 \mu F$, resistor 3 of $150\Omega$ and the resistor 4 of $1.8 K\Omega$, while the d.c. bias voltage applied to the terminal 6 is selected to 12V, the impedance Zin shows a locus such as shown in FIG. 2.

From FIG. 2, it will be apparent that a negative resistance component reaches maximum in the vicinity of 470MHz, and the two-terminal impedance Zin may equivalently be expressed as follows;

$$Zin = -R + j\omega L$$

The impedance Zin includes therein the negative resistance component $-R$ and an imaginary inductance component $j\omega$. Accordingly, Q-value of the two-terminal impedance Zin is given by $$Q = \omega L/-R$$

If the value of $-R$ is selected equal to the sum of values of the resistor 3 and the circuit loss, an inductance element having indefinite Q-value can be realized.

Since the circuit shown in FIG. 1 does not comprise real or actual impedance element at all, it is possible to realize a two-terminal impedance element comprising an imaginary inductance and negative resistance in a form of an integrated circuit.

Figure 3:
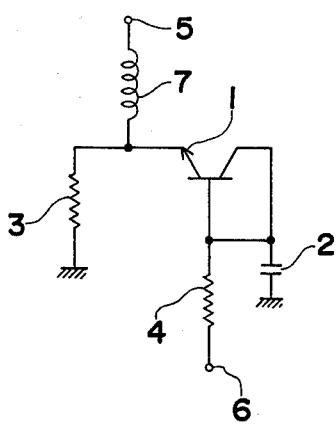
FIG. 3 is a circuit diagram of an embodiment of the invention which allows the circuit of FIG. 1 to be used for a low frequency.

The circuit shown in FIG. 3 is different from that of FIG. 1 in that an actual inductance 7 is inserted between the emitter of the transistor 1 and the terminal 5. With this circuit arrangement, inductance of a valve considerably greater than the inductance value available in the circuit shown in FIG. 1 can be attained. For this reason, the circuit shown in FIG. 3 is very useful to obtain an optimum value in a low frequency band for a resonance circuit formed in combination with a capacitor. It will be self-explanatory that a resonance circuit for a low frequency can be accomplished by using a capacitor having a large capacitance value. However, this will incur a decrease in the value of Q of the circuit, which thus can not be used as a narrow band filter. In contrast thereto, the circuit having an inductance 7 added as shown in FIG. 3 allows the loss provided by the inductance 7 to be compensated by the action of the negative resistance component produced between the emitter of the transistor 1 and the terminal 6.

Figure 4:
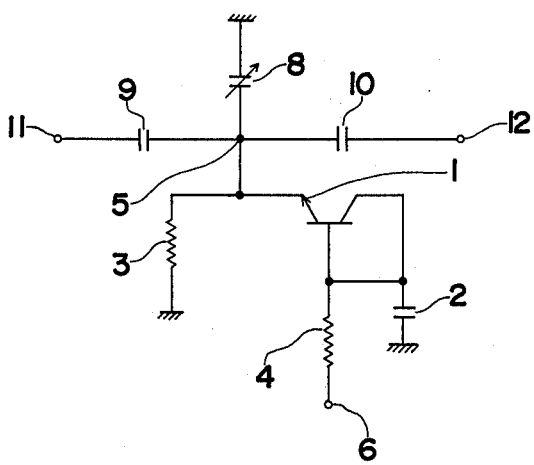
FIG. 4 is a circuit diagram of a band pass type active filter according to the invention in which the circuit shown in FIG. 1 is utilized.
Figure 5:
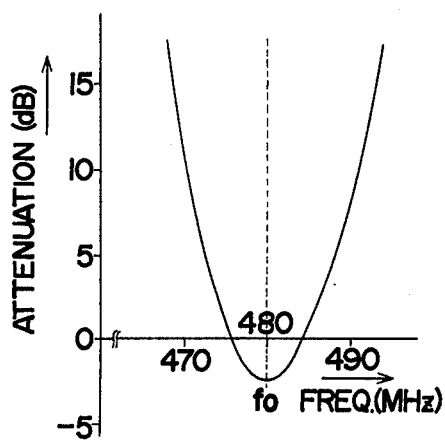
FIG. 5 shows graphically the attenuation characteristic of the circuit shown in FIG. 4.

FIG. 4 shows an active filter circuit of a bandpass type formed by connecting input terminals 11 and 12 to the terminal 5 of the two-terminal impedance circuit shown in FIG. 1 by way of coupling capacitors 9 and 10 and at the same time connecting a variable tuning capacitor 8 between the terminal 5 and the earth. The centre frequency $f_o$ of this band-pass filter may be shifted arbitrarily by means of the variable tuning capacitor 8. Since the active filter arranged in this manner contains a negative resistance component, insertion loss of the filter which is inevitably produced in the conventional LC circuits can be cancelled by virtue of the negative resistance component, so that a filter having no loss or filter having a gain at $f_o$ is now available. FIG. 5 shows a diagram illustrating the attenuation characteristic of the filter circuit shown in FIG. 4. From FIG. 5, it will be noted that gain of about 2dB is attained at $f_o$ of 480MHz. The attenuation characteristic can be varied by changing the bias voltage applied to the transistor 1 from the terminal 6 through the resistor 4. In other words, when the bias is set so as to decrease the negative resistance component, the insertion loss will be increased. On the contrary, if the bias is set so that the negative resistance component is increased, the insertion gain is increased, whereby signal component to be passed from the input terminal to the output terminal is amplified, while undesired signal components are subjected to attenuation as is in the case of conventional or hitherto known filter. The circuit shown in FIG. 4 has a narrow band-pass characteristic exhibiting an excellent selectivity as compared with the conventional filters.

Figure 6:
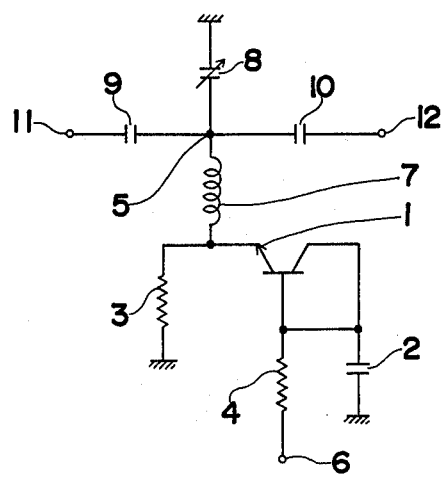
FIG. 6 is a circuit diagram of a band pass active filter for use at a low frequency in which the circuit shown in FIG. 3 is utilized.

FIG. 6 shows an active filter circuit of a bandpass type formed by connecting a variable capacitor 8 in parallel with the two-terminal impedance element shown in FIG. 3. This circuit is adapted to be used for a relatively lower frequency band as compared with the circuit of FIG. 4 and has a function and characteristic similar to those of the circuit shown in FIG. 4.

Figure 7:
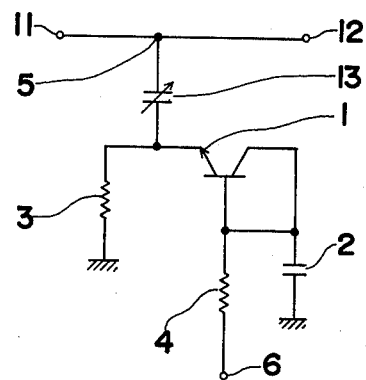
FIG. 7 is a circuit diagram of a band rejection active filter accordiing to the invention, a part of which is constituted by the circuit shown in FIG. 1.
Figure 8:
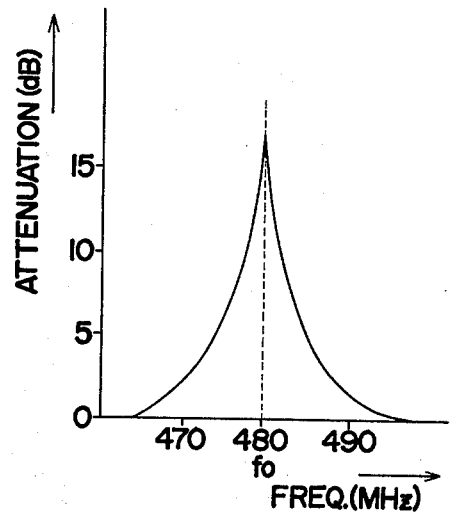
FIG. 8 graphically shows the attenuation characteristic of the circuit shown in FIG. 7.

FIG. 7 is a circuit diagram of an active filter of a band rejection type which is formed by inserting a variable tuning capacitor 13 between the terminal 5 and the emitter of the transistor 1 in the circuit shown in FIG. 1 and providing input and output terminals 11 and 12 at the terminal 5 of FIG. 1. The centre frequency $f_o$ of rejection band of this filter can be shifted arbitrarily by means of the variable tuning capacitor 13. In this band rejection filter circuit, because the impedance element including a negative resistance ascribable to the transistor 1 has a high Q, desired signal components from the input signal can be passed with substantially no loss, while undesired signal components are attenuated to the greatest possible degree. Further, this filter circuit shown in FIG. 7 can be manufactured in a miniaturized form of a light weight or in an integrated circuit. FIG. 8 shows attenuation characterisitic of the circuit shown in FIG. 7.

Figure 9:
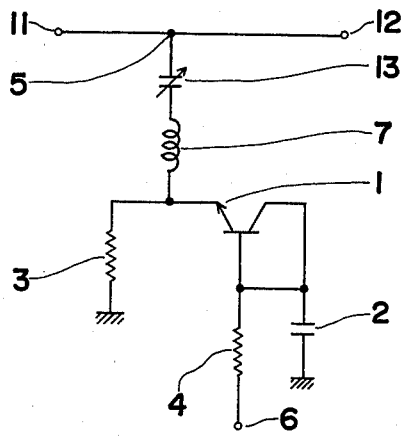
FIG. 9 is a circuit diagram of a band rejection active filter according to the invention incorporating therein the circuit shown in FIG. 3.

FIG. 9 shows another active filter circuit of a band rejection type which is constructed by inserting a variable tuning capacitor 13 between the inductance 7 and the terminal 5 of the two-terminal impedance element shown in FIG. 3 with input and output terminals 11 and 12 provided at the terminal 5 of FIG. 3. This filter circuit is adapted to be used for a low frequency at which the circuit shown in FIG. 7 can not exhibit an optimum band rejection characterisitic. The operation as well as characteristic of this filter are similar to those of the circuit shown in FIG. 7.

Figure 10:
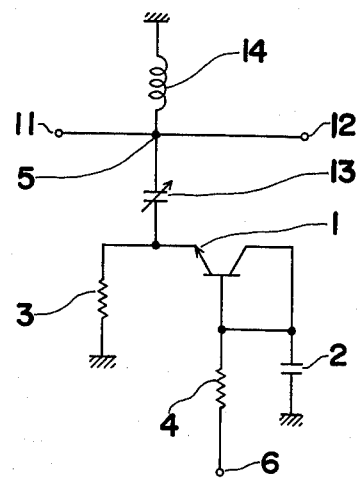
FIG. 10 is a circuit diagram showing a modification of the filter shown in FIG. 7.
Figure 11:
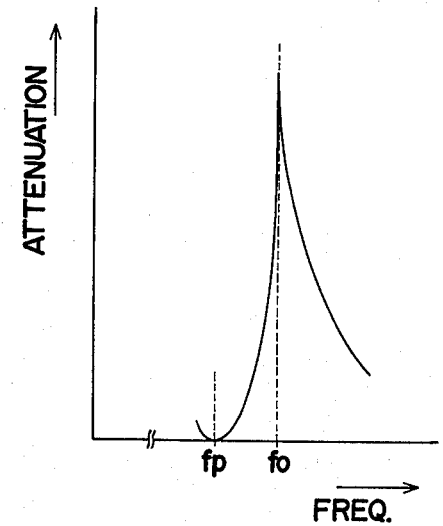
FIG. 11 shows graphically the attenuation characteristic of the circuit shown in FIG. 10.

FIG. 10 shows a variation of the band rejection active filter shown in FIG. 7 in which the characteristic of the latter circuit is improved by connecting an inductance 14 between the terminal 5 and the earth. In other words, this circuit provides a filter which can be used in the case where the band rejection centre frequency $f_o$ and the pass frequency $f_p$ are very close to each other. The attenuation characteristic in such case is such as shown in FIG. 11. The frequency $f_p$ lies in a frequency band lower than $f_o$. Since $f_p$ can be shifted in accordance with the selection of the inductance 14, $f_p$ can be set considerably closer to $f_o$. At that time, the attenuation of $f_o$ becomes greater and the attenuation of $f_p$ can be zero because of the negative resistance component included in the two-terminal network comprising the transistor 1. With this arrangement of circuit, a filter is provided which allows a narrow band signal transmisson for processing a large amount of information without requiring a large and complicated filter and a receiver of high quality.

Figure 12:
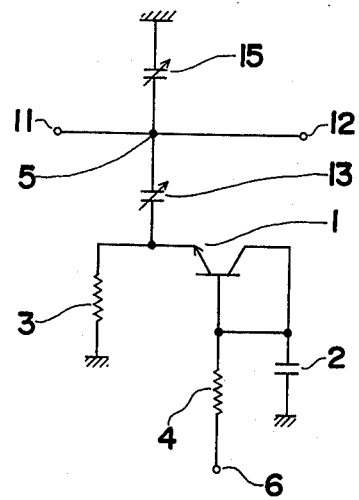
FIG. 12 is a circuit diagram of another modification of the circuit shown in FIG. 7.
Figure 13:
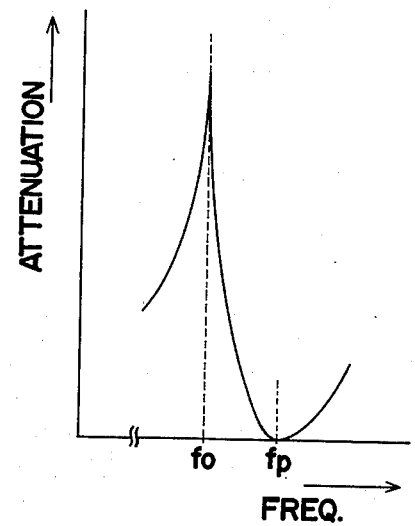
FIG. 13 is a graph showing the attenuation characteristic of the circuit shown in FIG. 12.

FIG. 12 shows an improved active filter of band rejection type formed by inserting a variable capacitor 15 between the terminal 5 and the earth in place of the inductance 14 of the circuit shown in FIG. 10. The characteristic of this filter circuit is such as shown in FIG. 13. It will be noted that $f_p$ lies in the frequency band higher than $f_o$. In this filter circuit, it is possible to cause the pass frequency $f_p$ to approach very closer to $f_o$. Because the attenuation of $f_o$ is very large while the insertion loss of $f_p$ is very low or zero, this filter is very advantageous for the narrow band communication.

Figure 14:
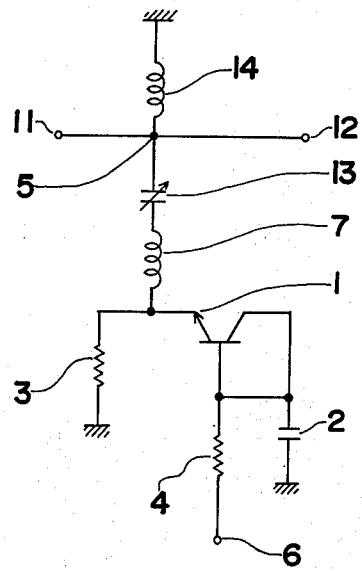
FIG. 14 is a circuit diagram of a modification of the circuit shown in FIG. 10 adapted for use at a low frequency.

FIG. 14 shows another modification of the circuit shown in FIG. 10 in which an inductance 7 is connected in series between the emitter of the transistor 1 and the variable tuning capacitor 13. This modified filter circuit is suited to perform function and operation similar to those of the circuit shown in FIG. 10 at a lower frequency than that of the latter. The loss produced due to the insertion of the inductance 7 can be cancelled or compensated by correspondingly varying the bias applied to the transistor 1 and hence the negative resistance component thereof.

Figure 15:
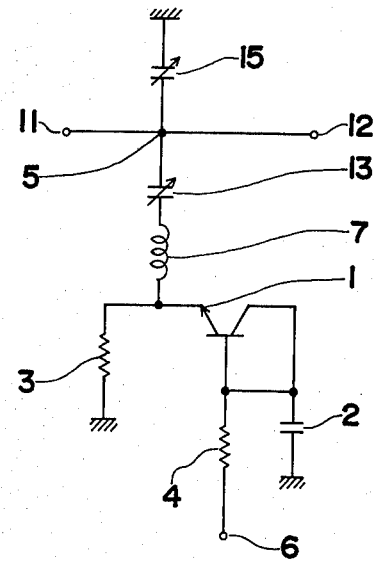
FIG. 15 is a circuit diagram showing a modification of the circuit shown in FIG. 12 adapted for use at a low frequency.

FIG. 15 shows a modification of the circuit shown in FIG. 12 in which an inductance 7 is inserted between the variable tuning capacitor 13 and the emitter of the transistor 1 and which circuit provides a performance similar to that of the circuit shown in FIG. 12 at a considerably lower frequency than that of the latter. The frequency characteristic of this filter is similar to the one shown in FIG. 13 but for $f_o$ and $f_p$ being shifted relatively to lower frequencies.

As is apparent from the foregoing description, with the circuit arrangements such as shown in FIGS. 1, 4, 7 and 12, it is possible to manufacture a filter circuit for a high frequency band in a form of an integrated circuit which has hithertobefore been considered impractical, which means a great contribution to the miniaturization of apparatus desired and wanted in the art. In other circuits according to the invention, inductance of a very small dimension as compared with the conventional one is sufficient for the desired operation, which thus allows a realization of the circuit in a much miniaturized size.

Further, the circuits according to the invention can be operated with small current and therefore may be used for a communication of a high quality by virtue of low noise produced in the circuits. The inventive filter can be reduced in weight and volume to 1/10 – 1/100 of the conventional large capacity type of filters.

What is claimed is:

1. Two-terminal active impedance circuit comprising a transistor having collector and base directly connected together, said base being applied with a bias voltage, a capacitor for connecting said collector to a first terminal, a resistor for connecting said emitter to said first terminal to thereby conduct direct current component to said first terminal, and a second terminal connected to said emitter.

2. Two-terminal active impedance circuit as set forth in claim 1, further comprising an inductance element connected between said emitter and said second terminal.

3. Active filter of a band-pass type comprising a transistor having collector and base directly connected together, said base being applied with a bias voltage, a capacitor for connecting said collector to a first terminal, a resistor for connecting said emitter to said first terminal to thereby conduct direct current component to said first terminal, a second terminal connected to said emitter, a variable capacitor inserted between said first and second terminals, and input and output terminals connected to said second terminal through respective coupling capacitors.

4. Active filter of a band-pass type comprising a transistor having collector and base directly connected together, said base being applied with a bias voltage, a capacitor for connecting said collector to a first terminal, a resistor for connecting said emitter to said first terminal to thereby conduct direct current component to said first terminal, a second terminal connected to said emitter through an inductance element, a capacitor inserted between said first and second terminals, and input and output terminals connected to said second terminal through respective coupling capacitors.

5. Active filter of a band rejection type comprising a transistor having collector and base directly connected together, said base being applied with a bias voltage, a capacitor for connecting said collector to a first terminal, a resistor for connecting said emitter to said first terminal to thereby conduct direct current component to said first terminal, a second terminal connected to said emitter through a variable capacitor, and input and output terminals connected to said second terminal.

6. Active filter of a band rejection type comprising a transistor having collector and base directly connected together, said base being applied with a bias voltage, a capacitor for connecting said collector to a first terminal, a resistor for connecting said emitter to said first terminal to thereby conduct direct current component to said first terminal, a second terminal connected to said emitter through a series connection of an inductance element and a variable capacitor, and input and output terminals connected to said second terminal.

7. Active filter of a band rejection type as set forth in claim 5, further comprising an inductance element connected between said first and second terminals.

8. Active filter of a band rejection type as set forth in claim 5, further comprising a variable capacitor connected between said first and second terminals.

9. Active filter of a band rejection type as set forth in claim 6, further comprising an inductance element connected between said first and second terminals.

10. Active filter of a band rejection type as set forth in claim 6, further comprising a variable capacitor connected between said first and second terminals.

* * * * *